US009647090B2

(12) United States Patent
Wang et al.

(10) Patent No.: US 9,647,090 B2
(45) Date of Patent: May 9, 2017

(54) SURFACE PASSIVATION FOR GERMANIUM-BASED SEMICONDUCTOR STRUCTURE

(71) Applicant: Taiwan Semiconductor Manufacturing Company, Ltd., Hsin-Chu (TW)

(72) Inventors: Kuan-Cheng Wang, Hsin-Chu (TW); Chien-Feng Lin, Hsin-Chu (TW); Jeng-Yang Pan, Hsin-Chu (TW); Keng-Chu Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/586,313

(22) Filed: Dec. 30, 2014

(65) Prior Publication Data

US 2016/0190286 A1    Jun. 30, 2016

(51) Int. Cl.

| H01L 21/336 | (2006.01) |
| H01L 29/66 | (2006.01) |
| H01L 21/02 | (2006.01) |
| H01L 21/30 | (2006.01) |
| H01L 29/165 | (2006.01) |

(52) U.S. Cl.
CPC .... *H01L 29/66795* (2013.01); *H01L 21/0245* (2013.01); *H01L 21/0262* (2013.01); *H01L 21/02505* (2013.01); *H01L 21/02532* (2013.01); *H01L 21/02639* (2013.01); *H01L 21/3003* (2013.01); *H01L 29/165* (2013.01)

(58) Field of Classification Search
CPC ......... H01L 2924/0002; H01L 2924/00; H01L 21/76825; H01L 23/5329; H01L 23/53295; H01L 21/76826; H01L 21/76829; H01L 23/53238; H01L 21/76814; H01L 21/76831; H01L 21/02203; H01L 21/3105; H01L 21/00
See application file for complete search history.

(56) References Cited

U.S. PATENT DOCUMENTS

| 7,425,740 B2 | 9/2008 | Liu et al. |
| 8,048,723 B2 | 11/2011 | Chang et al. |
| 8,053,299 B2 | 11/2011 | Xu |
| 8,183,627 B2 | 5/2012 | Currie |
| 8,415,718 B2 | 4/2013 | Xu |
| 8,497,177 B1 | 7/2013 | Chang et al. |

(Continued)

OTHER PUBLICATIONS

Pengfeu Guo et al., "Silicon Surface Passivation Technology for Germanium-Tin P-Channel MOSFETs: Suppression of Germanium and Tin Segregation for Mobility Enhancement," ECS Journal of Silid State Science and Technology 3 (8) Q162-Q168 (2014), 7 pages.

*Primary Examiner* — Robert Bachner
(74) *Attorney, Agent, or Firm* — Haynes and Boone, LLP (57) ABSTRACT

The present disclosure provides a method forming a semiconductor device in accordance with some embodiments. The method includes receiving a substrate having a fin protruding through the substrate, wherein the fin is formed of a first semiconductor material, exposing the substrate in an environment including hydrogen radicals, thereby passivating the protruded fin using the hydrogen radicals, and epitaxially growing a cap layer of a second semiconductor material to cover the protruded fin.

19 Claims, 9 Drawing Sheets

(56) References Cited

U.S. PATENT DOCUMENTS

| | | | |
|---|---|---|---|
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2002/0014625 A1* | 2/2002 | Asami | H01L 21/0237 257/57 |
| 2005/0170617 A1* | 8/2005 | Kurokawa | H01L 21/2807 438/483 |
| 2009/0121235 A1* | 5/2009 | Kim | H01L 21/823807 257/77 |
| 2012/0258602 A1* | 10/2012 | Subramani | C23C 16/08 438/758 |
| 2012/0261747 A1* | 10/2012 | Park | H01L 27/10814 257/330 |
| 2013/0056795 A1* | 3/2013 | Wu | H01L 29/66795 257/191 |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1* | 9/2014 | Oxland | H01L 29/66795 257/347 |

\* cited by examiner

SURFACE PASSIVATION FOR GERMANIUM-BASED SEMICONDUCTOR STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized. Similar developments in IC processing and manufacturing are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

A three dimensional transistor, such as a fin-like field-effect transistor (FinFET), has been introduced to replace a planar transistor. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

In terms of materials, germanium (Ge) and germanium-based materials, such as germanium-silicon (GeSi), germanium-tin ($Ge_{1-x}Sn_x$), etc., especially intrigue the IC industry to be considered as an alternative material than silicon (Si). More specifically, for the sub-10 nm technology nodes, Ge-based material and/or Ge is widely used as a channel for a high-performance p-type FET (e.g., FinFET) thanks to its smaller effective mass and higher hole mobility. However, in general, using Ge and Ge-based material may require an additional deposition of a Si layer to passivate the Ge surface so as to realize the mentioned higher hole mobility. Conventionally, depositing the passivated Si layer may be performed in an environment with a high pressure and a low temperature to avoid Ge atoms segregating into the Si layer. During production, this environmental requirement may further cause issues such as incontrollable depositing rate, undesirable chamber coating. Thus, an improved advance to passivate the Ge surface may be needed.

The present disclosure is generally related to semiconductor devices, and more particularly to semiconductor devices having FinFET structures that use germanium (Ge)-based material as conductive channels. It is an objective of the present disclosure to provide methods for effectively passivating fins while providing sufficient process windows and a more compatible fabrication condition for semiconductor device fabrications.

Figure 1:
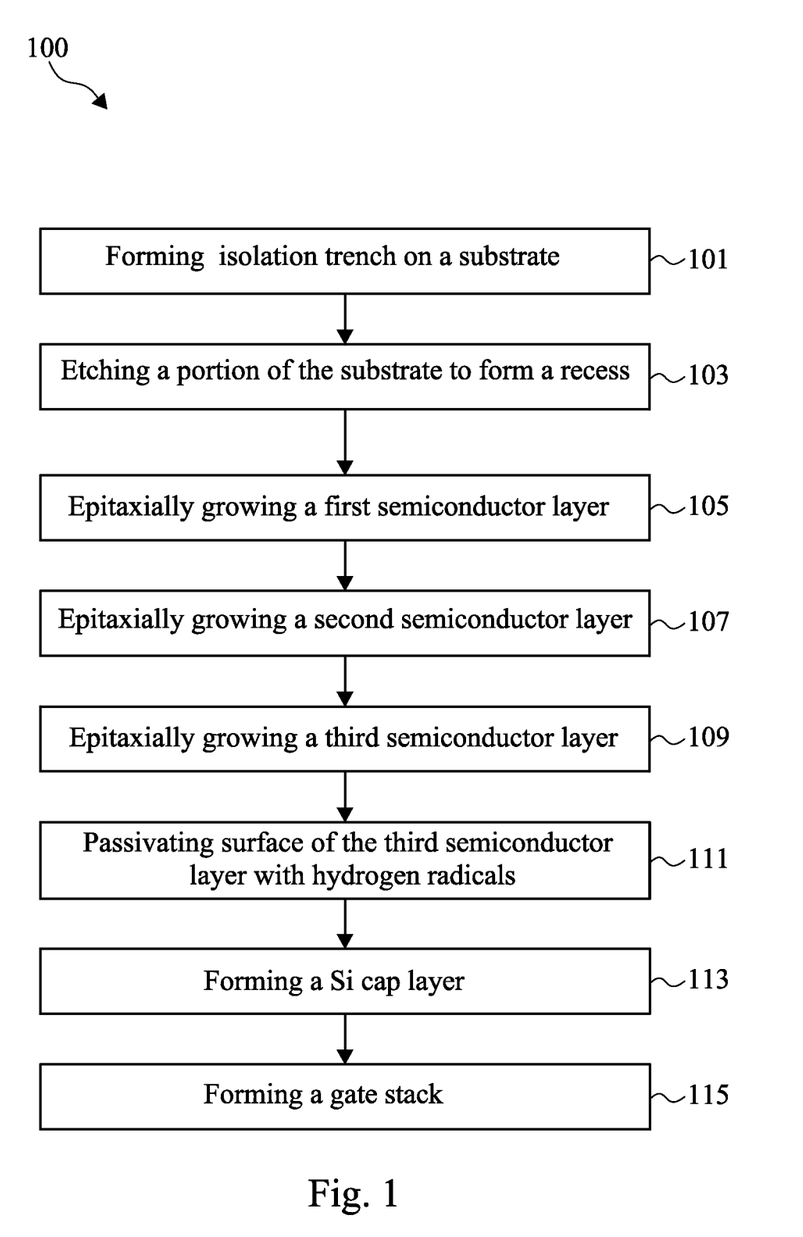
FIG. 1 shows a flow chart to illustrate a method making a semiconductor structure constructed according to various aspects of the present disclosure in accordance with some embodiments.

Referring now to FIG. 1, a flow chart of a method 100 of forming a semiconductor device is illustrated according to various aspects of the present disclosure. The method 100 is merely an example, and is not intended to limit the present disclosure. Additional operations can be provided before, during, and after the method 100, and some operations described can be replaced, eliminated, or moved around for additional embodiments of the method. The method 100 is described below in conjunction with FIGS. 2A-H that illustrate a portion of a semiconductor device 200 at various fabrication stages. The device 200 may be an intermediate device fabricated during processing of an IC, or a portion thereof, that may comprise SRAM and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and/or combinations thereof.

Figure 2A:
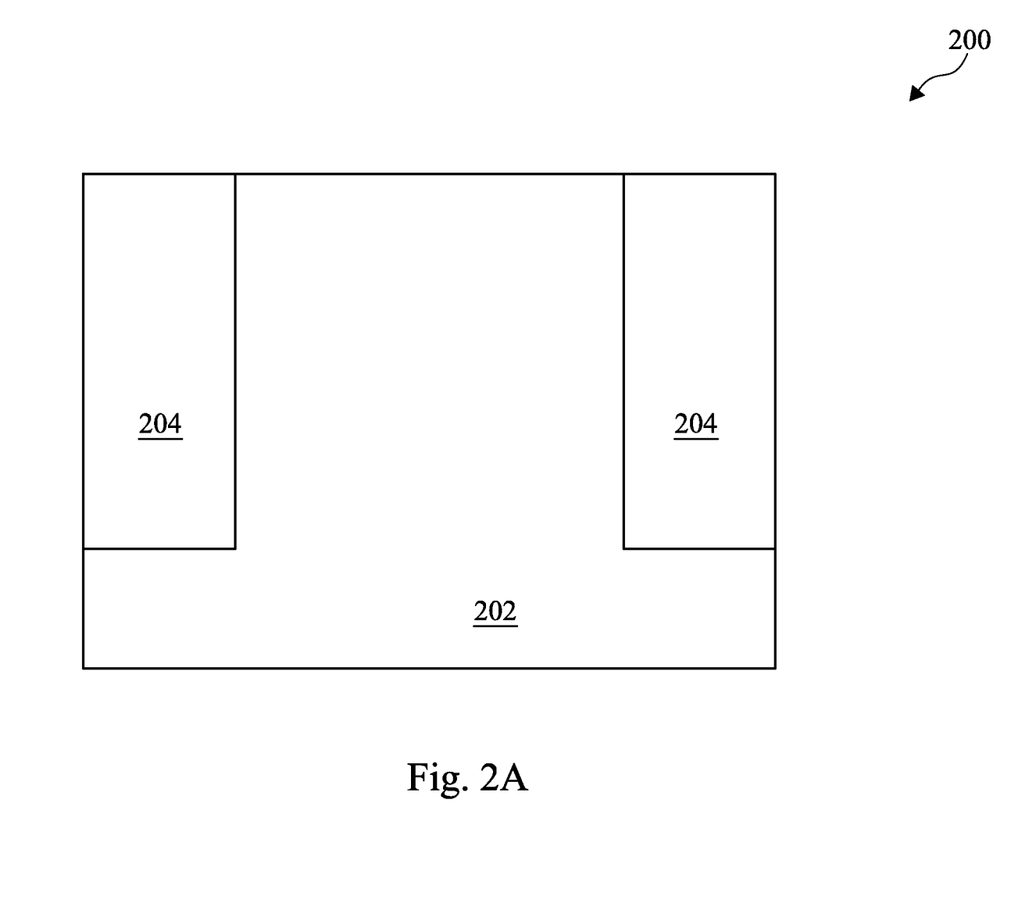
FIGS. 2A-2H are sectional views of a semiconductor structure at various fabrication stages constructed in accordance with some embodiments.

The method 100 starts at operation 101 with forming isolation features 204 on a substrate 202 as shown in FIG. 2A. The operation 101 will be discussed in conjunction with FIG. 2A. In accordance with some illustrative embodiments, isolation features 204, such as various shallow trench isolation (STI) features, are formed in the semiconductor substrate 202. In one example, the top surface of the semiconductor substrate 202 and the top surfaces of the STI features 204 may be coplanar, resulting in a common top surface. In another example, the top surface of the semiconductor substrate 202 and the top surfaces of the STI features 204 are not coplanar, resulting in a three-dimensional structure, such as a fin FET (FinFET) structure.

The substrate 202 is a silicon substrate in the present embodiment. Alternatively, the substrate 202 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 202 is a semiconductor-on-insulator (SOI) such as a buried dielectric layer.

In some embodiments, the formation of the STI features 204 includes, forming a hard mask with openings that define the regions for STI features; etching the semiconductor substrate 202 through the openings of the hard mask to form trenches in the semiconductor substrate; depositing one or more dielectric material to fill in the trenches; and performing a chemical mechanical polishing (CMP) process. As one embodiment for illustration, the depth of the STI features 204 ranges between about 50 nm and about 500 nm. In one example, the formation of the hard mask includes depositing a hard mask layer; a lithography process to form a patterned resist layer on the hard mask layer; and etching the hard mask layer using the patterned resist layer as an etch mask. In some examples, the deposition of the dielectric material further includes thermal oxidation of the trenches and then filling in the trenches by the dielectric material, such as silicon oxide, by CVD. In one example, the CVD process to fill in the trenches includes high density plasma CVD (HDPCVD). In some embodiments, the formation of the STI features 204 further includes removing the hard mask after CMP. In another embodiment, the hard mask includes a silicon oxide layer by thermal oxidation and a silicon nitride on the silicon oxide layer by chemical vapor deposition (CVD).

Figure 2B:
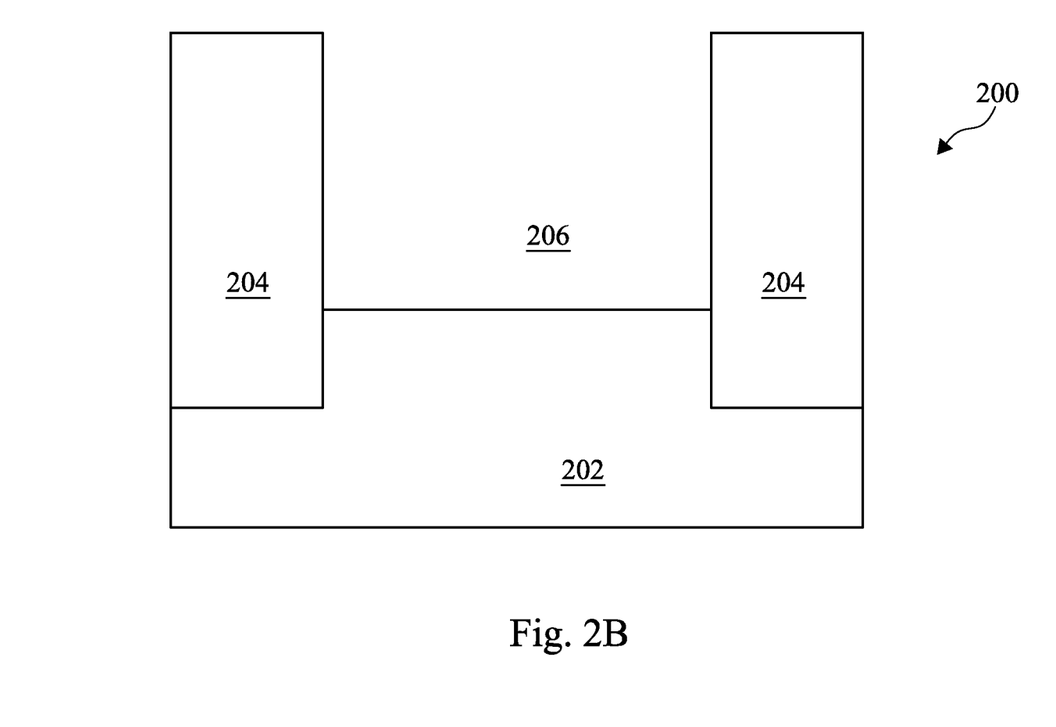

The method 100 continues at operation 103 with etching a portion of the substrate 204 between the STI features 204 as shown collectively in FIG. 2B. At operation 103, the method 100 etches the substrate 202 to form a recess 206. The etching processes may include dry etching, wet etching, reactive ion etching (RIE), and/or other suitable processes. As shown in FIG. 2B, the recess 206 is surrounded by the STI features 204 as recess sidewalls and the substrate 202 as a recess bottom.

Figure 2C:
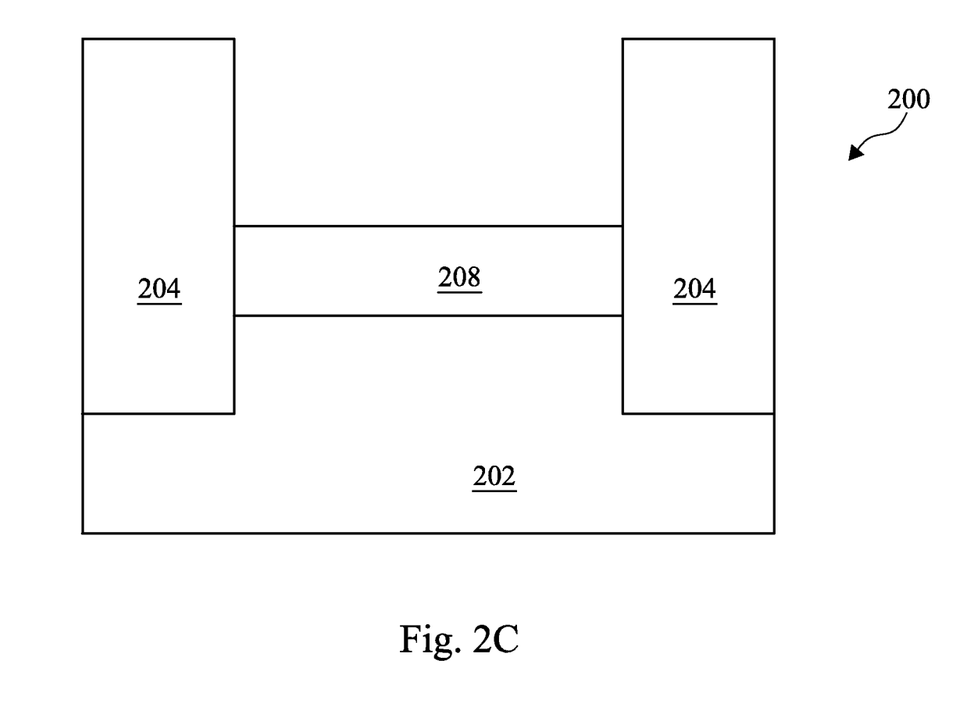

Referring back to FIG. 1, the method continues at operation 105 with epitaxially growing a first semiconductor layer 208 in the recess 206. The operation 105 will be discussed in conjunction with FIG. 2C. In the present embodiment, one layer of epitaxy material will be grown. In other embodiments, two layers or more than two layers of epitaxy may be grown without departing from the inventive scope of the present disclosure. Referring to FIG. 2C, the first semiconductor layer 280 is epitaxially grown in the recess 206, filling a bottom portion of the recess 206. In an embodiment, the first semiconductor layer 208 may be silicon or a silicon alloy such as silicon germanium or silicon carbide. That is, in some embodiments the first semiconductor layer 208 may be formed of the same semiconductor material as substrate 202 while in other embodiments first semiconductor layer 208 may be formed of a different semiconductor material than substrate 202.

Figure 2D:
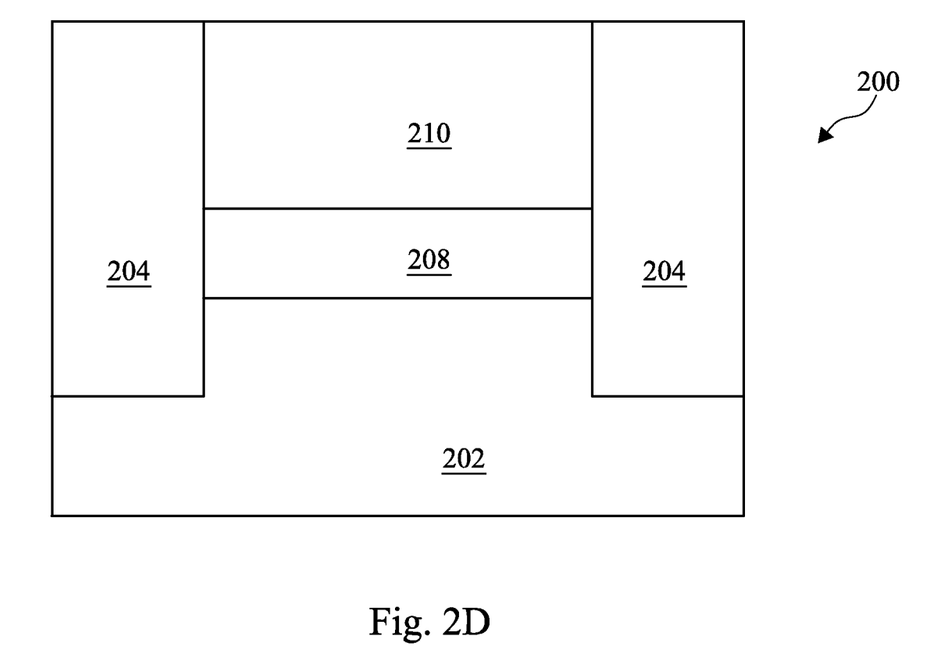

Referring back to FIG. 1, the method continues at operation 107 with epitaxially growing a second semiconductor layer 210 in the recess 206. Referring to FIG. 2D, a second semiconductor layer 210 is epitaxially grown in the recess 206, interfacing with the first semiconductor layer 208. In an embodiment, the second semiconductor layer 210 may be silicon or a silicon alloy such as silicon germanium. Despite not being shown in FIG. 2D, after the epitaxial growth of the second semiconductor layer 210, a CMP process may be performed to remove excessive portion of the second semiconductor layer 210 so as to planarize the top surface of the device 200. Furthermore, in some embodiments the second semiconductor layer 210 may be formed of the same semiconductor material as first semiconductor layer 208 while in other embodiments second semiconductor layer 210 may be formed of a different semiconductor material than first semiconductor layer 208.

Figure 2E:
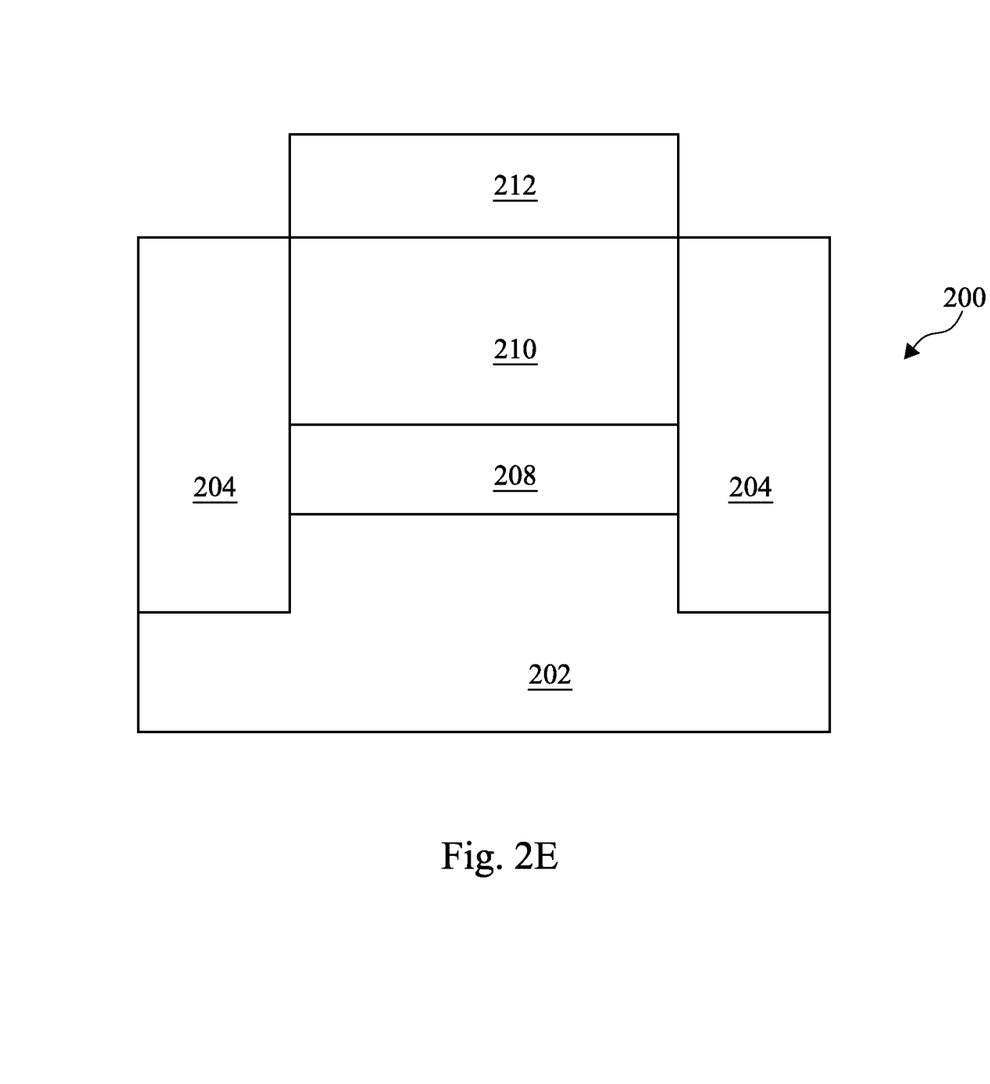

Subsequently, the method continues at operation 109 with epitaxially growing a third semiconductor layer 212 on the second semiconductor layer 210, as shown in FIG. 2E. In order to have the third semiconductor layer 212 aligned with the recess 206 filled with the first and second semiconductor layers 208 and 210, the operation 109 may include further photolithography and etching processes after the epitaxial growth of the third semiconductor layer 212. Furthermore, in some embodiments the third semiconductor layer 212 may be formed of the same semiconductor material as second semiconductor layer 210 while in other embodiments third semiconductor layer 212 may be formed of a different semiconductor material than second semiconductor layer 210.

In the present embodiment, the third semiconductor layer 212 is referred to as the channel of the device 200. Further, the third semiconductor layer 212 (i.e., the channel) is tuned to have compressive strain so as to enhance carrier mobility in the device 200 (i.e., p-type FinFET). Compressive strain may be created by having a larger crystalline lattice constant in the third semiconductor layer 212 than in the second semiconductor layer 210. In one example, the third semiconductor layer 212 is silicon germanium and the second semiconductor layer 210 is silicon. In another example, the third semiconductor layer 212 is silicon carbide and the second semiconductor layer 210 is silicon. In yet another example, both the second and third layers 210 and 212 are silicon germanium but the third semiconductor layer 212 contains a higher ratio of germanium to silicon than the second semiconductor layer 210 does. In the present embodiment, the second semiconductor layer 210 is also referred to as a strain relaxation buffer (SRB) layer. In various embodiments, the epitaxially grown semiconductor layers 208, 210, and 212 may each be formed by one or more selective epitaxial growth (SEG) processes. In an embodiment, the SEG process is a low pressure chemical vapor deposition (LPCVD) process using a silicon-based precursor gas.

As mentioned above, Germanium (Ge) and Ge-based materials, such as silicon germanium (SiGe) and germanium tin (GeSn), are promising high mobility channel materials for high-performance p-type metal-oxide-semiconductor field-effect transistors (MOSFETs) especially when the technology node is below 10 nm. To achieve such high performance, including high turn-on current and low leakage current, it is desirable to develop a thermodynamically stable high-k/Ge-based channel gate stack. More specifically, such stable gate stack may require low interface trap density and small equivalent oxide thickness with premium gate control. Generally, before depositing a gate dielectric layer (i.e., high-k), an ultrathin Si cap layer is formed on the Ge-based channels to passivate the Ge-based surface.

Conventionally, forming this Si cap layer is performed via flowing disilane ($Si_2H_6$) that is carried by carrier gas, hydrogen molecules ($H_2$). $H_2$ is used to provide as many as hydrogen-terminated Si atoms on the surface of the Ge or Ge-based channel so as to suppress Ge atoms on the top surface to diffuse into the Si cap layer. This diffusion of Ge is also known as Ge segregation effect. In order to further improve (suppress) the Ge segregation effect, several approaches has been explored. In an example, growing the Si cap layer at an ultra-low temperature (e.g., <200° C.) may increase the activation energy of the subsurface Ge atoms thus reducing the Ge segregation effect, but such low temperature may result in poor quality of the Si layer. In another example, while growing the Si cap layer, a low-temperature (e.g., ~370° C.) and high-pressure (e.g., >10 Torr) environment is used to realize a one-step Si layer deposition. However, this approach may disadvantageously suffer from the Ge segregation effect due to the fact that the temperature at 370° C. still favors the occurrence of the Ge segregation effect.

The present embodiment is directed to using low-temperature (e.g., <200° C.) remote hydrogen plasma to generate hydrogen radicals while passivating the Ge and/or Ge-based channels (e.g., third semiconductor layer 212). In general, the hydrogen radicals generated from the remote hydrogen plasma is more active and more effective than the hydrogen molecules ($H_2$) in terms of providing hydrogen-terminated Si atoms. Thus, using the hydrogen radicals to form a passivation layer (hydrogen-terminated Si atoms) on the Ge or Ge-based channel (e.g. third semiconductor layer 212) before growing the Si cap layer may advantageously provide a more effective way to achieve a more thermodynamically stable gate stack.

Figure 2F:
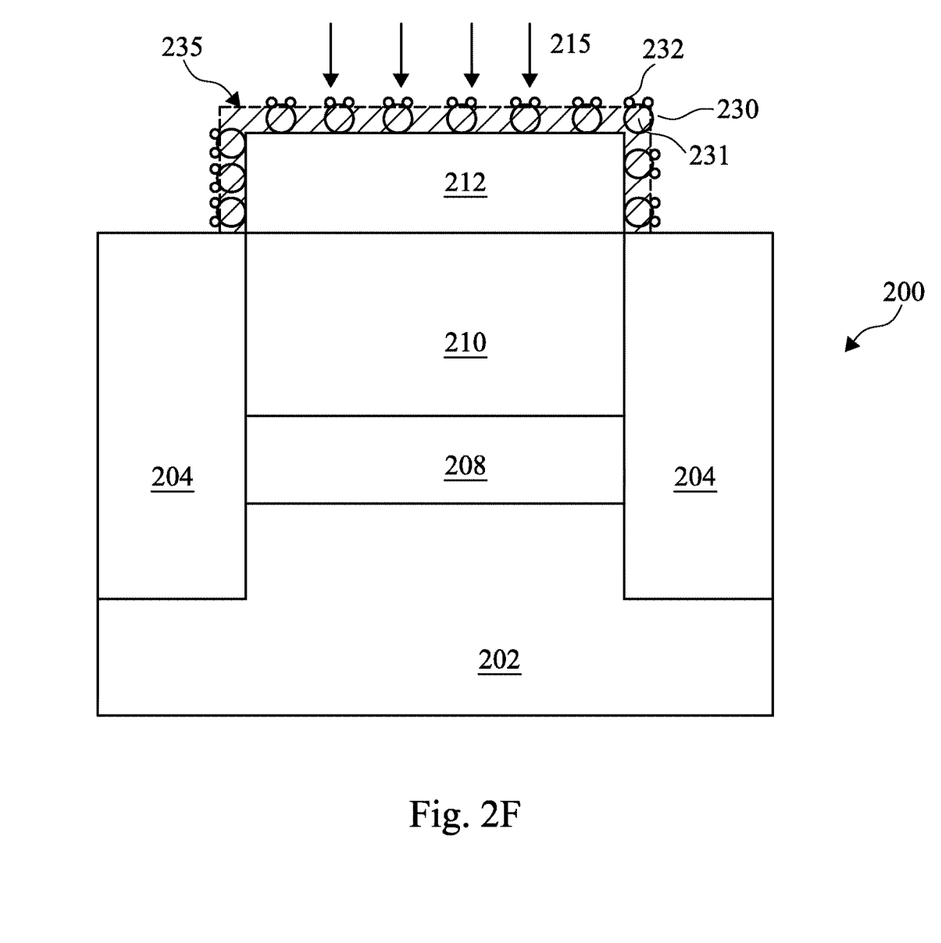

Referring back to FIG. 1, after epitaxially forming the third semiconductor layer 212 at operation 109, the method 100 continues at operation 111 with growing a passivation layer 235 on the surface of third semiconductor layer 212. The operation 111 will be discussed in conjunction with FIG. 2F. As shown in FIG. 2F, the passivation layer 235 includes at least one monolayer of hydrogen-terminated Si atoms 230, wherein the hydrogen-terminated Si atoms 230 includes a Si atom 231 and one or more hydrogen atoms 232 bonded to the Si atom 231. In accordance with the present embodiments, the bonded hydrogen atom 232 is provided by the hydrogen radicals 215 and the hydrogen radicals 215 are generated by a remote hydrogen plasma source. As shown, the passivation layer 235 wraps around the third semiconductor layer 212.

More specifically, at operation 111, the device substrate 202 is placed in a first compartment of a chamber that contains a remote hydrogen plasma source. Prior to passivating the Ge-based channel surface, a pre-cleaning process (not shown), via ammonia and/or nitrogen trifluoride ($NH_3$ and/or $NF_3$) plasma treatment, may be used to remove any residual native oxide layer formed on the surface of the Ge-based third semiconductor layer 212. Growing the passivation layer 235 may include flowing disilane ($Si_2H_6$) as a precursor with a controllable flow rate into the first compartment of the chamber. Although disilane ($Si_2H_6$) is used in the current embodiment, other gaseous precursors of element silicon (Si) may be sued, including but not limited to, silane ($SiH_4$), dichlorosilane ($SiH_2Cl_2$), and silicon tetrachloride ($SiCl_4$). In accordance with some illustrative embodiments, operation 111 may be performed at a temperature lower than 200° C. and at a pressure lower than 50 Torr.

Figure 2G:
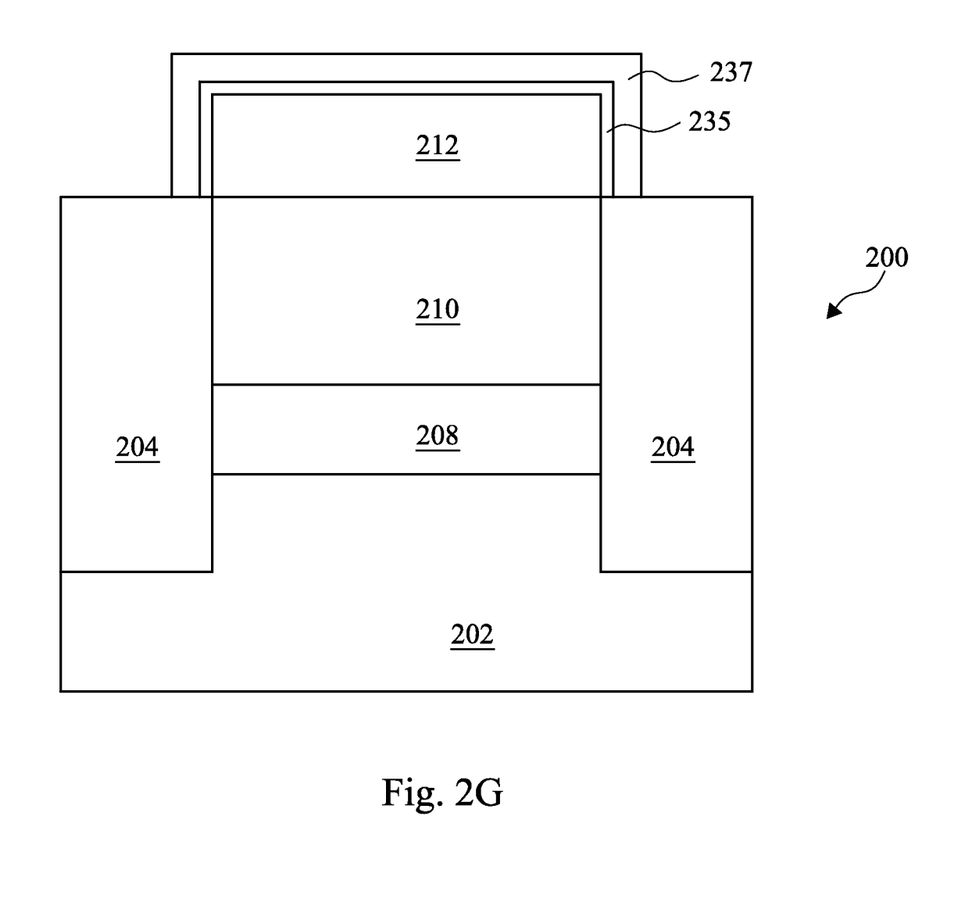

Referring to FIG. 1, the method 100 continues at operation 113 with forming a Si cap layer 237 on the passivation layer 235. As shown, the Si cap layer 237 wraps around the passivation layer 235. In some embodiments, the Si cap layer 237 may be epitaxially grown by a deposition process, including CVD, atomic layer deposition (ALD), sputtering, molecular beam epitaxy (MBE), and/or other suitable methods. Further, forming the Si cap layer 237 may be performed in a second compartment of the chamber by flowing gaseous precursor of silicon (Si), including disilane ($Si_2H_6$) and silane ($SiH_4$). In accordance with various illustrative embodiments, a rate to grow the Si cap layer 237 is around 3 monolayers/hour, resulting in a thickness that ranges from 2~10 monolayers of silicon. Since the Ge-based channel 212 is covered by the passivation layer 235, epitaxially growth of the Si cap layer may not be subjected to a low-temperature (<200° C.) growth. A higher-temperature growth which leads to a higher deposition rate of the Si layer may be implemented according to a suitable application. In an alternative illustration, operation 111 and 113 may be integrated into a single operation, which means that forming the passivation layer 235 and the Si cap layer 237 is performed in a same compartment.

Figure 2H:
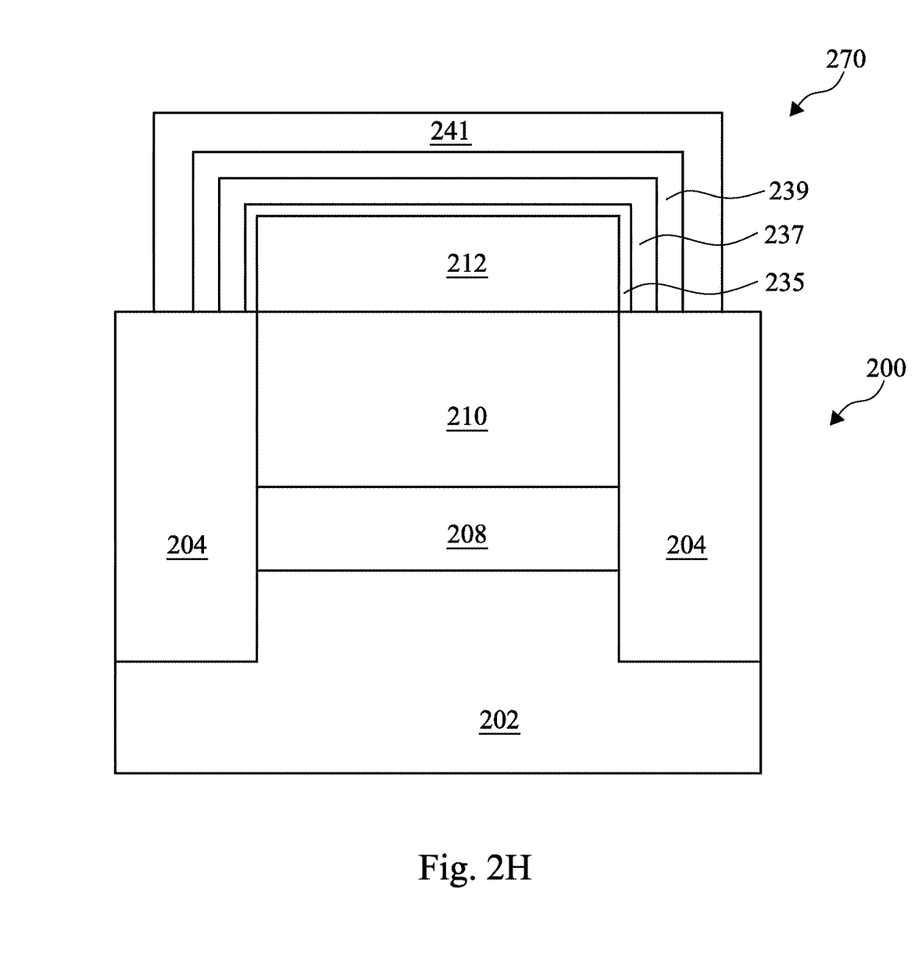

Referring to FIG. 1, the method 100 continues at operation 115 with forming a gate stack 270 over the Si cap layer 237. The operation 115 will be discussed in conjunction with FIG. 2H. As shown in FIG. 2H, the gate stack 270 is formed on the Si cap layer 237 wrapping around the channel 212. More specifically, forming the gate stack 270 further includes depositing a gate dielectric layer 239 over the Si cap layer 237, and deposing a gate electrode layer 241 over the gate dielectric layer 239.

In one such embodiment, the gate dielectric layer 239 includes an interfacial layer deposited by a suitable method, such as ALD, CVD, ozone oxidation, etc. The interfacial layer may include silicon oxide, HfSiO, silicon nitride, silicon oxynitride, and/or other suitable material. In some embodiments, the gate dielectric layer 239 includes a high-k dielectric layer deposited on the interfacial layer by a suitable technique, such as ALD, CVD, metal-organic CVD (MOCVD), PVD, thermal oxidation, combinations thereof, and/or other suitable techniques. The high-k dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), or other suitable materials.

The gate electrode layer 241 is then formed by ALD, PVD, CVD, or other suitable process, and may include a single layer or multiple layers, such as a metal layer, a liner layer, a wetting layer, and/or an adhesion layer. The gate electrode layer 241 may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to produce a substantially planar top surface of the gate stack 270. After the gate stack 270 is formed, the substrate 202 may be provided for further fabrication, such as contact formation and further fabrication of the interconnect structure.

The present disclosure provides methods using hydrogen radicals to form a monolayer to passivate Ge or Ge-based channel of a semiconductor device so as to suppress diffusion of Ge atoms into a Si cap layer. Suppression of the Ge atom diffusing into the Si cap layer may provide a more thermodynamically stable gate stack. Thus, using such hydrogen radicals may advantageously provide a more effective and more production-compatible way to fabricate a semiconductor device.

The present disclosure provides a method forming a semiconductor device in accordance with some embodiments. The method includes receiving a substrate having a fin protruding through the substrate, wherein the fin is formed of a first semiconductor material, exposing the substrate in an environment including hydrogen radicals, thereby passivating the protruded fin using the hydrogen radicals, and epitaxially growing a cap layer of a second semiconductor material to cover the protruded fin.

The present disclosure provides a method forming a semiconductor device in accordance with some other embodiments. The method includes forming a semiconductor material over a semiconductor substrate, performing a hydrogen radical treatment process to the semiconductor material, forming a capping layer over the treated semiconductor material, and forming a gate electrode over the capping layer.

The present disclosure provides a method to perform a treatment on a semiconductor device in accordance with some embodiments. The method includes placing a semiconductor structure in a chamber having a remote plasma source coupled thereto, generating a hydrogen plasma in the remote plasma source, the hydrogen plasma comprising hydrogen radicals, exposing a surface of the semiconductor structure to the hydrogen plasma, and epitaxially growing a cap layer on the exposed surface of the semiconductor structure.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   receiving a substrate having a fin protruding through the substrate, wherein the fin is formed of a first semiconductor material;
   exposing the fin of the first semiconductor material in an environment including hydrogen radicals, thereby forming a passivation layer on the protruded fin, the passivation layer including at least one monolayer of hydrogen-terminated silicon atoms; and
   epitaxially growing a cap layer of a second semiconductor material to cover the protruded fin.

2. The method of claim 1, wherein the first semiconductor material includes a material selected from the group consisting of germanium, germanium silicon, and germanium tin; and wherein the second semiconductor material is silicon.

3. The method of claim 1, wherein the passivation layer is formed directly on a top surface and sidewalls of the protruded fin.

4. The method of claim 1, wherein the passivation layer includes bonded hydrogen atoms.

5. The method of claim 1, wherein the epitaxially growing of the cap layer include epitaxially growing the cap layer of the second semiconductor material directly on the passivation layer.

6. The method of claim 1, wherein the substrate is subjected to be processed neither at temperatures greater than 200° C. nor under pressures greater than 50 Torr.

7. A method comprising:
   forming a semiconductor material over a semiconductor substrate;
   performing a hydrogen radical treatment process to the semiconductor material;
   forming a capping layer over the treated semiconductor material; and
   forming a gate electrode over the capping layer, wherein
   the semiconductor material is protruded from the semiconductor substrate; and
   the passivation layer is formed directly on a top surface and sidewalls of the protruded semiconductor material.

8. The method of claim 7, wherein forming the semiconductor material over a semiconductor substrate includes forming a recess in the semiconductor substrate and forming the semiconductor material in the recess.

9. The method of claim 7, wherein forming the semiconductor material over the semiconductor substrate includes:
   forming a first semiconductor material layer over the semiconductor substrate;
   forming a second semiconductor material layer over the first semiconductor material layer; and
   forming a third semiconductor material layer over the second semiconductor material layer.

10. The method of claim 9, wherein the first semiconductor material layer is different than the second semiconductor material layer and the second semiconductor material layer is different than the third semiconductor material layer.

11. The method of claim 7, wherein the capping layer is formed of another semiconductor material.

12. The method of claim 7, wherein the performing of the hydrogen radical treatment process to the semiconductor material results in a passivation layer being formed over the semiconductor material, the passivation layer includes at least one monolayer of hydrogen-terminated silicon atoms.

13. The method of claim 12, wherein the passivation layer includes bonded hydrogen atoms.

14. A method, comprising:
   placing a semiconductor structure having a first semiconductor material in a chamber having a remote plasma source coupled thereto;
   generating a hydrogen plasma in the remote plasma source, the hydrogen plasma comprising hydrogen radicals; and
   exposing a surface of the first semiconductor material to the hydrogen plasma, thereby forming a passivation layer having a hydrogen-terminated silicon atoms.

15. The method of claim 14, wherein the exposing of the surface of the first semiconductor material to the hydrogen plasma further includes exposing the surface of the first semiconductor material to a silicon-containing precursor.

16. The method of claim 15, further comprising epitaxially growing a cap layer of a second semiconductor material directly on the passivation layer, wherein the first semiconductor material includes germanium-based material and the second semiconductor material includes silicon.

17. The method of claim 14, wherein the passivation layer includes bonded hydrogen atoms.

18. The method of claim 14, wherein
   the semiconductor structure is a fin of a fin field-effect transistor (Fin FET);
   the semiconductor material is protruded from a semiconductor substrate; and
   the passivation layer is formed directly on a top surface and sidewalls of the protruded semiconductor material.

19. The method of claim 14, wherein the semiconductor structure is subject to neither temperatures greater than 200° C. nor pressures greater than 50 Torr.

* * * * *